(12) United States Patent
Kamiya et al.

(10) Patent No.: US 9,419,245 B2
(45) Date of Patent: Aug. 16, 2016

(54) ORGANIC EL DISPLAY DEVICE

(71) Applicant: Japan Display Inc., Tokyo (JP)

(72) Inventors: Akinori Kamiya, Tokyo (JP); Toshihiro Sato, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/471,053

(22) Filed: Aug. 28, 2014

(65) Prior Publication Data

US 2015/0060822 A1  Mar. 5, 2015

(30) Foreign Application Priority Data

Aug. 30, 2013  (JP) ................................. 2013-180706

(51) Int. Cl.
*H01J 9/00* (2006.01)
*H01J 1/62* (2006.01)
*H01L 51/52* (2006.01)

(52) U.S. Cl.
CPC ........ *H01L 51/5253* (2013.01); *H01L 51/5225* (2013.01)

(58) Field of Classification Search
USPC .......... 257/59, 88, E33.001, 98, E51.018, 89, 257/40, E51.022; 345/76; 427/511; 438/29, 438/22, 46, 34, 35
See application file for complete search history.

(56) References Cited

U.S. PATENT DOCUMENTS

| 7,771,246 B2* | 8/2010 | Hirai | H01L 51/0005 313/506 |
| 8,049,405 B2* | 11/2011 | Adachi | H01L 27/3246 313/501 |
| 8,697,504 B2* | 4/2014 | Bale | H01L 27/3274 257/40 |
| 2003/0030766 A1* | 2/2003 | Kiguchi | G02B 5/201 349/106 |
| 2003/0064171 A1 | 4/2003 | Burrows et al. | |
| 2003/0080338 A1* | 5/2003 | Yamazaki et al. | 257/59 |
| 2004/0017162 A1* | 1/2004 | Sato et al. | 315/169.3 |
| 2004/0119419 A1* | 6/2004 | Kai | H01L 27/3246 315/169.3 |
| 2004/0124770 A1* | 7/2004 | Hayashi | H01L 51/5203 313/506 |
| 2004/0160165 A1* | 8/2004 | Yamauchi | H01L 27/3246 313/498 |
| 2004/0252088 A1* | 12/2004 | Kawachi et al. | 345/76 |
| 2005/0007322 A1* | 1/2005 | Adachi et al. | 345/82 |
| 2005/0082969 A1* | 4/2005 | Tokuda et al. | 313/506 |
| 2006/0178013 A1* | 8/2006 | Moriya | H01L 27/3246 438/765 |
| 2006/0214575 A1* | 9/2006 | Kajiyama et al. | 313/506 |
| 2007/0063645 A1* | 3/2007 | Yokoyama | 313/506 |
| 2009/0026467 A1* | 1/2009 | Yanagihara | H01L 27/3246 257/88 |
| 2010/0181554 A1* | 7/2010 | Yoshida | H01L 51/5209 257/40 |
| 2010/0193817 A1* | 8/2010 | Amamiya | H01L 51/5004 257/98 |
| 2010/0289728 A1* | 11/2010 | Nakatani et al. | 345/76 |
| 2011/0180821 A1* | 7/2011 | Matsushima | H01L 27/3246 257/88 |
| 2014/0159031 A1* | 6/2014 | Aonuma et al. | 257/40 |
| 2014/0191216 A1* | 7/2014 | Matsumoto et al. | 257/40 |
| 2015/0206928 A1* | 7/2015 | Kimura | H01L 51/5271 257/88 |

FOREIGN PATENT DOCUMENTS

JP  2007-156058 A  6/2007
JP  4303591 B  5/2009

* cited by examiner

*Primary Examiner* — Mary Wilczewski
*Assistant Examiner* — Tsz Chiu
(74) *Attorney, Agent, or Firm* — Typha IP LLC

(57) ABSTRACT

In an organic EL display device configured in which an acrylic resin layer is disposed under a barrier layer that protects an OLED for flattening the barrier layer, floating the barrier layer caused by penetration of moisture into the acrylic resin can be prevented. A side surface of a bank formed in a boundary of pixels is formed into a cliff part having an inclination angle of 90° or larger in most portions of a circumstance of each pixel part, and formed into a gently sloped part having the inclination angle smaller than 90° in a part of the circumference. The electrode parts disposed within the respective pixels are connected to each other through an electrode part disposed on an upper surface of the bank, and electrode parts disposed on the gently sloped parts to form an OLED common electrode.

4 Claims, 12 Drawing Sheets

ORGANIC EL DISPLAY DEVICE

CROSS-REFERENCE TO RELATED APPLICATION

The present application claims priority from Japanese application JP2013-180706 filed on Aug. 30, 2013, the content of which is hereby incorporated by reference into this application.

BACKGROUND OF THE INVENTION

1. Field of the Invention

The present invention relates to an organic electroluminescence (EL) display device, and more particularly to a technique for improving the reliability of a sealing film that covers an upper portion of an organic light emitting element.

2. Description of the Prior Art(s)

FIG. 12 is a schematic partially cross-sectional view of a display area of a related art organic EL display device 2, which illustrates a cross section along a horizontal direction of a display area. The organic EL display device 2 has a structure in which a TFT substrate 4 and an counter substrate 6 are bounded with each other through a filler layer 8 sandwiched therebetween. The TFT substrate 4 is formed, for example, in such a manner that a circuit part 12, an OLED part 14, and a sealing layer 16 are laminated on a glass substrate 10. The counter substrate 6 is formed, for example, in such a manner that a color filter 22 is laminated on a glass substrate 20.

An organic light emitting diode (OLED) which is an organic light emitting element is formed for each pixel in the OLED part 14 of the TFT substrate 4, and a bank is formed in a boundary between the adjacent pixels as a partition between those pixels. The OLED includes a lower electrode 30, an organic layer 32, and an upper electrode 34. The lower electrode 30 and the upper electrode 34 configure an anode electrode (anode) and a cathode electrode (cathode) of the OLED, respectively. The upper electrode 34 is formed to be shared with pixels in an overall display area, and applied with a common voltage from a drive part. On the other hand, the lower electrode 30 is formed for each of the pixels. A bank is formed between the respective adjacent pixels with an insulating layer, and electrically isolates the respective lower electrodes 30 from each other.

The sealing layer 16 is laminated on the OLED part 14. In response to a fact that the characteristic of the OLED is deteriorated by moisture, the sealing layer 16 has a moisture-proof function for protecting the OLED from moisture, for example, contained in the filler layer 8. The sealing layer 16 is formed in such a manner that a first barrier layer 40, which is an inorganic passivation film made of silicon nitride (SiN), a flattening layer 42 made of acrylic resin, and a second barrier layer 44, which is the same inorganic passivation film as that of the first barrier layer 40, are laminated in the stated order (refer to Japanese Patent No. 4303591 and JP 2007-156058 A). In this configuration, the first barrier layer 40 and the second barrier layer 44 function as a sealing film for blocking the transmission of a material that deteriorates the OLED such as moisture.

On the other hand, the flattening layer 42 flattens the irregularity of a surface of the first barrier layer 40. As the flattening layer 42, acrylic monomer is adhered onto the surface of the first barrier layer 40 by vapor deposition or the like. The acrylic monomer has fluidity, is aggregated on an irregular portion by surface tension, and makes the undulation of the irregular portion gentle. With this property, inner corners 50 at steps of pixel edges which are caused by the banks are filled with the acrylic monomer for smoothing. The acrylic monomer is polymerized by the irradiation of ultraviolet rays into acrylic resin in a state where the irregularity is thus smoothed. With the provision of the flattening layer 42, the second barrier layer 44 is optimally formed.

SUMMARY OF THE INVENTION

Japanese Patent No. 4303591 and JP 2007-156058 A disclose a configuration in which an organic film is formed as the flattening layer over a substantially overall surface of an area where the sealing layer is formed. In this example, when a defect such as a damage is produced in the barrier layer 44 of an upper side, and the flattening layer 42 is exposed from the barrier layer 44, a phenomenon (hereinafter referred to as "layer floating") that the flattening layer 42 is swelled with the penetration of moisture, and the barrier layer 44 is peeled off from the flattening layer 42 is liable to occur. The layer floating of the second barrier layer 44 is defective, impairs the reliability of the sealing layer 16, and causes a yield of the organic EL display device to be reduced.

From this viewpoint, in a related art configuration illustrated in FIG. 12, the amount of an organic material configuring the flattening layer 42 is decreased to localize the organic material in the irregular portion so that the flattening layer 42 is not formed on a portion in which the lower barrier layer 40 is flat. This makes it possible to lower a probability that the layer floating is generated when a defect is generated in the upper barrier layer 44.

However, since the organic material aggregated in the step portion of each pixel edge produces a relative large spread of skirts 52, the probability that the layer floating is generated due to the defect of the barrier layer 44 is not sufficiently low. For that reason, even in the related art configuration illustrated in FIG. 12, the suppression of the layer floating is not sufficient.

The invention has been made to solve the above problems, and aims at providing an organic EL display device that reduces the spread of the skirt of an organic material aggregated in the step portion of the pixel edge to further reduce the probability of the layer floating, and improves the reliability of the sealing layer.

(1) According to the invention, there is provided an organic EL display device in which a plurality of pixels each having an organic light emitting element having an organic material laminated between a lower electrode and an upper electrode is arrayed in a display area, the organic EL display device including: cliff-like banks that are formed along boundaries of the pixels, and each have a side surface whose inclination angle is 90° or larger; and a sealing layer that includes two sealing films made of silicon compound and a flattening resin sandwiched between the sealing films, is laminated in the display area having the bank formed, and covers the organic light emitting elements, in which the side surface of each bank is formed with a forward tapered slope face having the inclination angle smaller than 90° in a part of a circumference of each pixel, and in which the upper electrode is a common electrode that includes an in-pixel electrode part laminated within each pixel, a pixel boundary electrode part laminated on an upper surface of the bank, and a slope electrode part which is laminated on the forward tapered slope face and is connecting the in-pixel electrode part and the pixel boundary electrode part, and the respective in-pixel electrode parts are connected to each other through the slope electrode part and the pixel boundary electrode part.

(2) In the organic EL display device according to the above item (1), the in-pixel electrode part and the pixel boundary electrode part can be divided on a side surface of the cliff-like portion of the bank.

(3) In the organic EL display device according to the above item (1) or (2), the forward tapered slope face can be formed on both side surfaces of a part of the bank between the adjacent pixels.

(4) In the organic EL display device according to the above item (3), the cliff-like portion of the bank includes a first bank layer and a second bank layer laminated on the first bank layer, the second bank layer is made of a material different from that of the first bank layer, and protrudes laterally from the first bank layer, and a portion of the bank in which the forward tapered slope faces of the bank are formed on both side surfaces thereof includes a third bank layer formed separately from the first and second bank layers.

(5) In the organic EL display device according to the above items (1) to (4), the sealing film is made of silicon compound, and the flattening resin is a resin obtained by polymerizing organic monomer having fluidity adhered onto the lower sealing film.

DETAILED DESCRIPTION OF THE INVENTION

Figure 1:
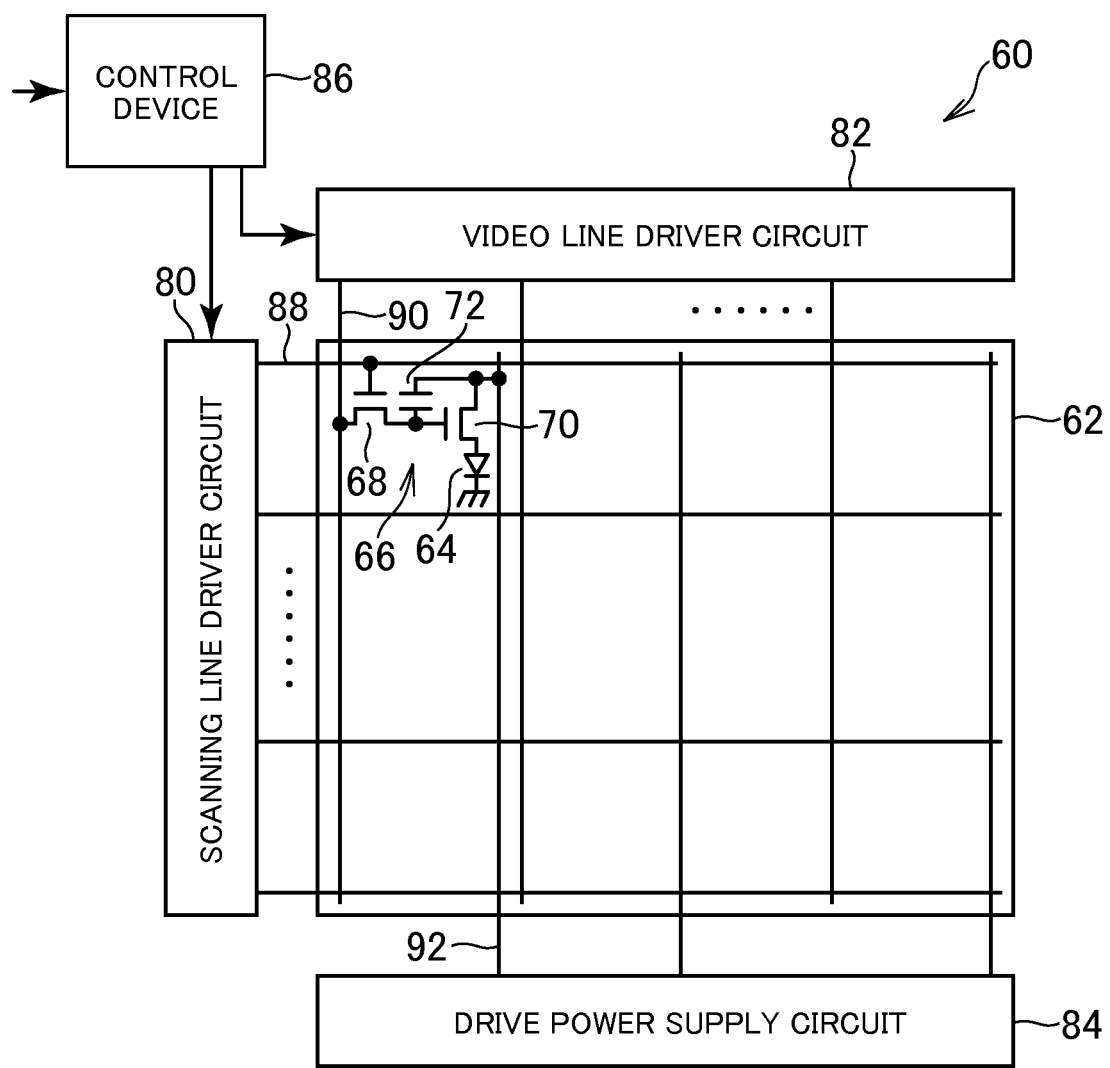
FIG. 1 is a schematic view illustrating a configuration of an outline of an organic EL display device according to an embodiment of the invention.

Hereinafter, embodiments of the invention will be described with reference to the accompanying drawings.
First Embodiment An organic EL display device represents an active matrix display device, and is mounted as a display panel on a television, a personal computer, a mobile terminal, or a cellular phone. FIG. 1 is a schematic view illustrating a configuration of an outline of an organic EL display device 60 according to a first embodiment. The organic EL display device 60 includes a pixel array part 62 that displays an image, and a drive part that drives the pixel array part 62.

OLEDs 64 and pixel circuits 66 are arranged in a matrix in correspondence with pixels in the pixel array part 62. Each of the pixel circuits 66 includes a plurality of thin film transistors (TFTs) 68 and 70, and a capacitor 72.

On the other hand, the drive part includes a scanning line driver circuit 80, a video line driver circuit 82, a drive power supply circuit 84, and a control device 86, and drives the pixel circuits 66, and controls light emission of the OLEDs 64.

The scanning line driver circuit 80 is connected to scanning signal lines 88 provided for respective alignments (pixel rows) of the pixels in a horizontal direction. The scanning line driver circuit 80 selects the scanning signal lines 88 according to a timing signal input from the control device 86 in order, and applies a voltage for turning on the lighting TFTs 68 to a selected one of the scanning signal lines 88.

The video line driver circuit 82 is connected to video signal lines 90 provided for respective alignments (pixel columns) of the pixels in a vertical direction. The video line driver circuit 82 receives a video signal from the control device 86, and outputs a voltage corresponding to a video signal of the selected pixel row to the respective video signal lines 90 according to the selection of the scanning signal lines 88 by the scanning line driver circuit 80. The voltage is written in the capacitor 72 through the lighting TFT 68 on the selected pixel row. The drive TFT 70 supplies a current corresponding to a written voltage to the OLEDs 64 whereby the OLEDs 64 of pixels corresponding to the selected scanning signal line 88 emit light.

The drive power supply circuit 84 is connected to drive power supply lines 92 provided for respective pixel columns, and supplies a current to the OLEDs 64 through the drive power supply lines 92 and the drive TFTs 70 on the selected pixel line.

In this example, an anode of each OLED 64 is connected to the drive TFT 70. On the other hand, a cathode of each OLED 64 is basically connected to a ground potential, and the cathodes of all the pixels OLEDs 64 are configured by a common electrode.

Figure 2:
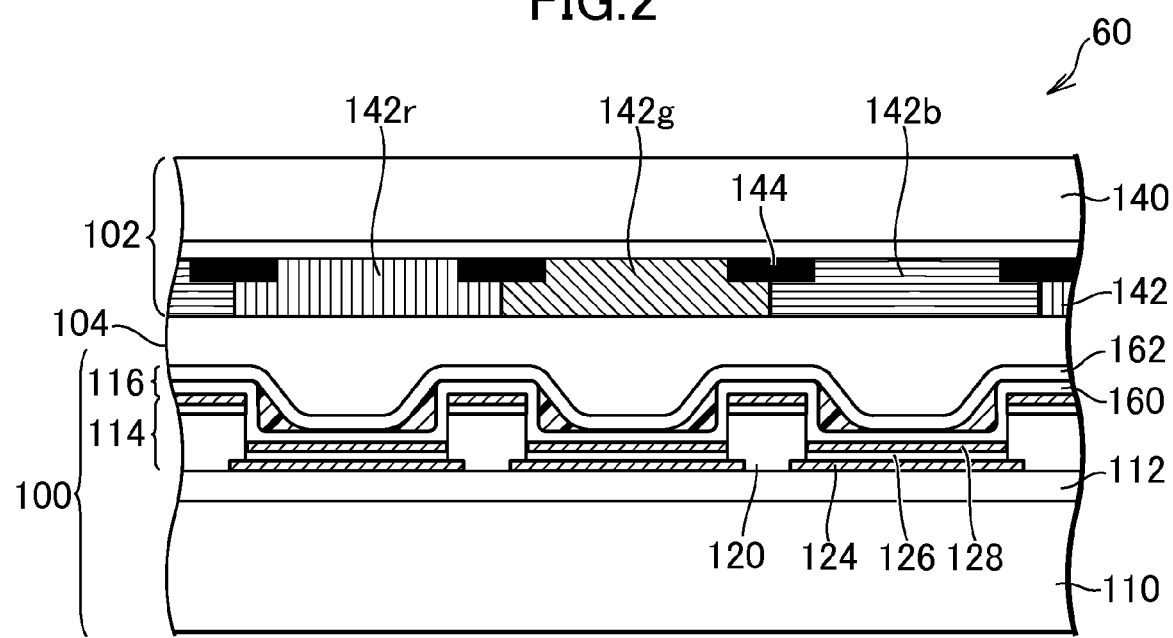
FIG. 2 is a schematic partial cross-sectional view of a pixel array part of the organic EL display device according to the embodiment of the invention.

FIG. 2 is a schematic partial cross-sectional view of the pixel array part 62 of the organic EL display device 60, which illustrates a cross-section along the horizontal direction of the display area. The organic EL display device 60 has a structure in which a TFT substrate 100 and a counter substrate 102 are bonded together through a filler layer 104 sandwiched therebetween. In this embodiment, the pixel array part 62 is of a top emission type, the OLEDs 64 that form a light emitting part are formed on the TFT substrate 100, and the pixel array part 62 emits the light generated by the OLEDs from the counter substrate 102. That is, in FIG. 2, the light of the OLEDs are emitted upward. Also, a coloring system in the organic EL display device 60 illustrated in FIG. 2 is a color filter system, a white light is generated by the OLEDs, and the white light passes through a color filter to obtain respective colors of RGB.

The TFT substrate 100 has a structure in which, for example, a circuit part 112, an OLED part 114, and a sealing layer 116 are laminated on a glass substrate 110.

The circuit part 112 includes the pixel circuits 66, scanning signal lines 88, the video signal lines 90, and the drive power supply lines 92 described above, and is formed on a surface of the glass substrate 110. Also, at least a part of the driver circuits 80, 82, the power supply circuit 84, and the control device 86 can be integrated with the pixel array part 62 on the TFT substrate 100 as the circuit part 112. In FIG. 2, a detailed structure of the circuit part 112 is omitted in FIG. 2.

The OLED part 114 includes an OLED formed in each pixel, and banks 120 formed in the respective pixel boundaries. The OLED is configured in such a manner that a lower electrode 124, an organic layer 126, and an upper electrode 128 are laminated on each other in the stated order. The organic layer 126 includes a hole transport layer, a light emitting layer, and an electron transport layer. As has been already described, the OLEDs 64 of this embodiment generates the white light. Specifically, the light emitting layer is configured by a laminated body of the light emitting layers of the respective colors R, G, and B, and the lights by the organic electroluminescence of the respective colors of R, G, and B are mixed together to generate the white light.

The lower electrode 124 and the upper electrode 128 configure the anode and the cathode of the OLED 64, respectively, and the light emission from the light emitting layer is controlled according to an electric signal applied between the lower electrode 124 and the upper electrode 128. As described above, the upper electrode 128 is basically shared with the respective pixels in the overall display area, and a common voltage is applied to the upper electrode 128 from the drive part. A structure of the upper electrode 128 (common electrode) will be described in detail, separately. The lower electrode 124 (pixel electrode) is formed for each pixel, and a current corresponding to a video signal is supplied to each lower electrode 124 from the drive part and the pixel circuit 66.

Each of the banks 120 is formed of an insulating layer between the respective pixels, and electrically isolates the respective lower electrodes 124 from each other. The sealing layer 116 is laminated on the OLED part 114. The sealing layer 116 has a function of inhibiting the transmission of moisture contained in the filler layer 104, and protecting the OLED. Structures of the banks 120 and the sealing layer 116 will be described in detail, separately.

The counter substrate 102 has, for example, a structure in which a color filter 142 is laminated on a transparent substrate such as a glass substrate 140. The color filter 142 selectively transmits a light of a component corresponding to a color of a pixel in the white light generated by the OLED. For example, as the color filter 142, a color filter 142*r* that transmits a wavelength band of red is arranged in correspondence with an R pixel, a color filter 142*g* that transmits a wavelength band of green is arranged in correspondence with a G pixel, and a color filter 142*b* that transmits a wavelength band of blue is arranged in correspondence with a B pixel. A black matrix 144 is arranged in the boundaries of the color filters 142*r*, 142*g*, and 142*b*.

The TFT substrate 100 and the counter substrate 102 are bonded together in such a manner that the sealing layer 116 and the color filter 142 face each other through the filler layer 104 sandwiched therebetween.

Figure 3:
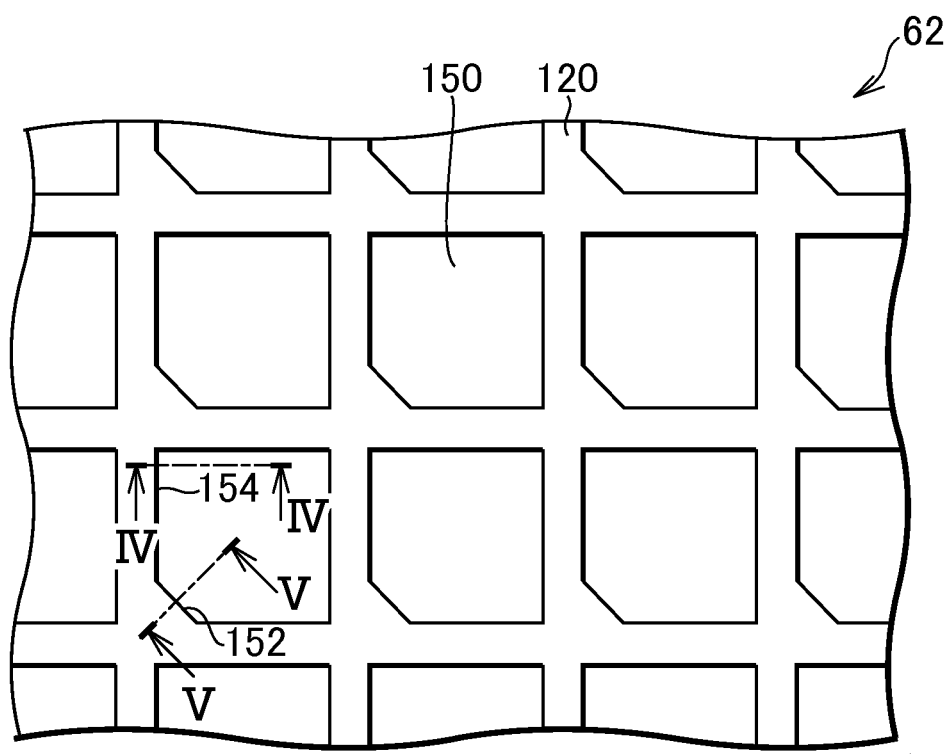
FIG. 3 is a schematic partial plan view of a pixel array part of an organic EL display device according to a first embodiment of the invention.

FIG. 3 is a schematic partial plan view of the pixel array part 62 of the organic EL display device 60, and illustrates a pixel part 150 corresponding to each pixel, and the bank 120 that surrounds the pixel part 150. A side surface of the bank 120 is formed at an inclination angle (β) substantially perpendicular to the glass substrate 110, or larger in most portions of a circumstance of each pixel part 150. The side surface of the bank 120 is formed with a slope face having a gentle inclination angle (α) in a part of the circumstance thereof. In this example, α<β is fulfilled. Hereinafter, a portion in which the inclination angle of the side surface of the bank 120 is β is called "cliff part", and a portion in which the inclination angle is α is called "gently sloped part". In an example illustrated in FIG. 3, a lower left corner of the pixel part 150 represents a gently sloped part 152, and the remaining edge of the pixel part 150 represents a cliff part 154.

Figure 4:
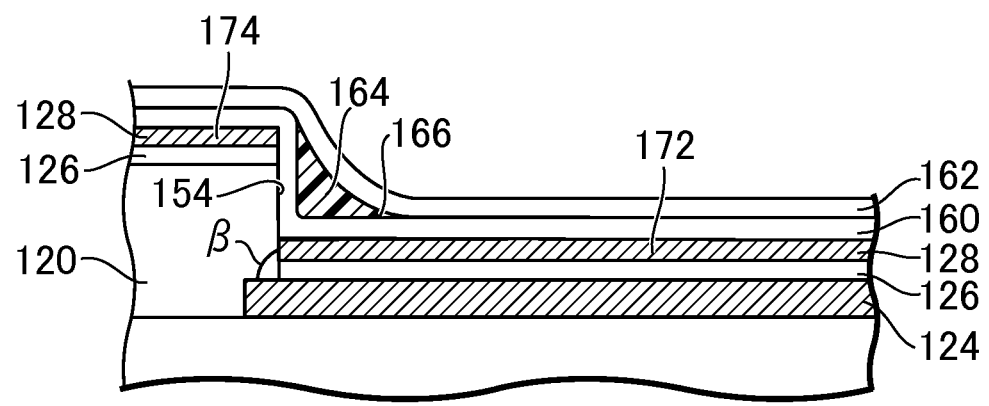
FIG. 4 is a partially cross-sectional view of an pixel in a cliff part.
Figure 5:
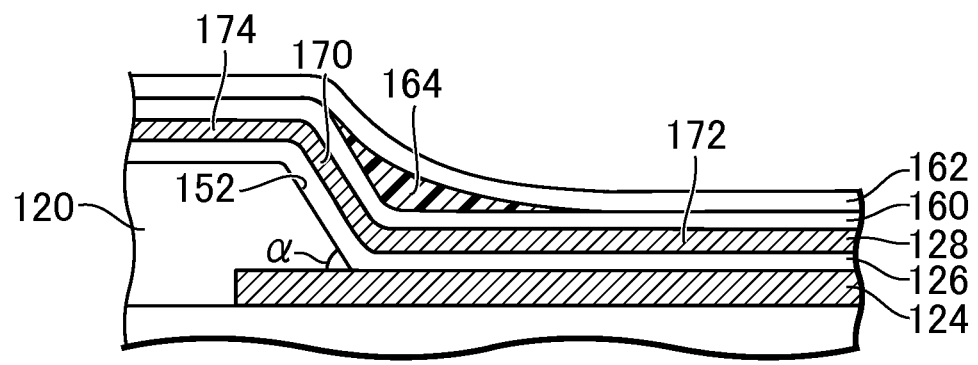
FIG. 5 is a partially cross-sectional view of the pixel in a gently sloped part.

FIG. 4 is a partially cross-sectional view of the pixel in the cliff part 154, which is a schematic perpendicular cross-sectional view of the pixel part 150 and the bank 120 taken along a line IV-IV illustrated in FIG. 3. On the other hand, FIG. 5 is a partially cross-sectional view of the pixel in the gently sloped part 152, which is a schematic perpendicular cross-sectional view of the pixel part 150 and the bank 120 along a line V-V illustrated in FIG. 3.

First, a laminated structure of the sealing layer 116 will be described with reference to FIGS. 4 and 5. The sealing layer 116 includes two layers of barrier layers 160 and 162 made of silicon compound, and a flattening layer (flattening resin) 164 sandwiched between the barrier layers 160 and 162. The barrier layers 160 and 162 have a function of a sealing film that inhibits the transmission of a material such as moisture which deteriorates the OLED. The flattening layer 164 flattens the irregularity of a surface of the lower barrier layer (first barrier layer 160). Monomer having fluidity adheres to the surface of the first barrier layer 160 by vapor deposition as the flattening layer 164. The monomer is aggregated on an irregular portion, and makes the undulation of the irregular portion gentle. With this property, the inner corner at a step of the pixel edge which is caused by the bank 120 is filled with the monomer for smoothing. In this example, the amount of monomer adhered to the first barrier layer 160 is adjusted to be localized in the irregular portion, and the monomer layer is not basically formed in a portion where the first barrier layer 160 is flat. In this way, the monomer is polymerize into resin in a state where the irregularity is smoothed. The flattening layer 164 smooths the irregular portion, and improves a coatability of the upper barrier layer (second barrier layer 162).

Figure 12:
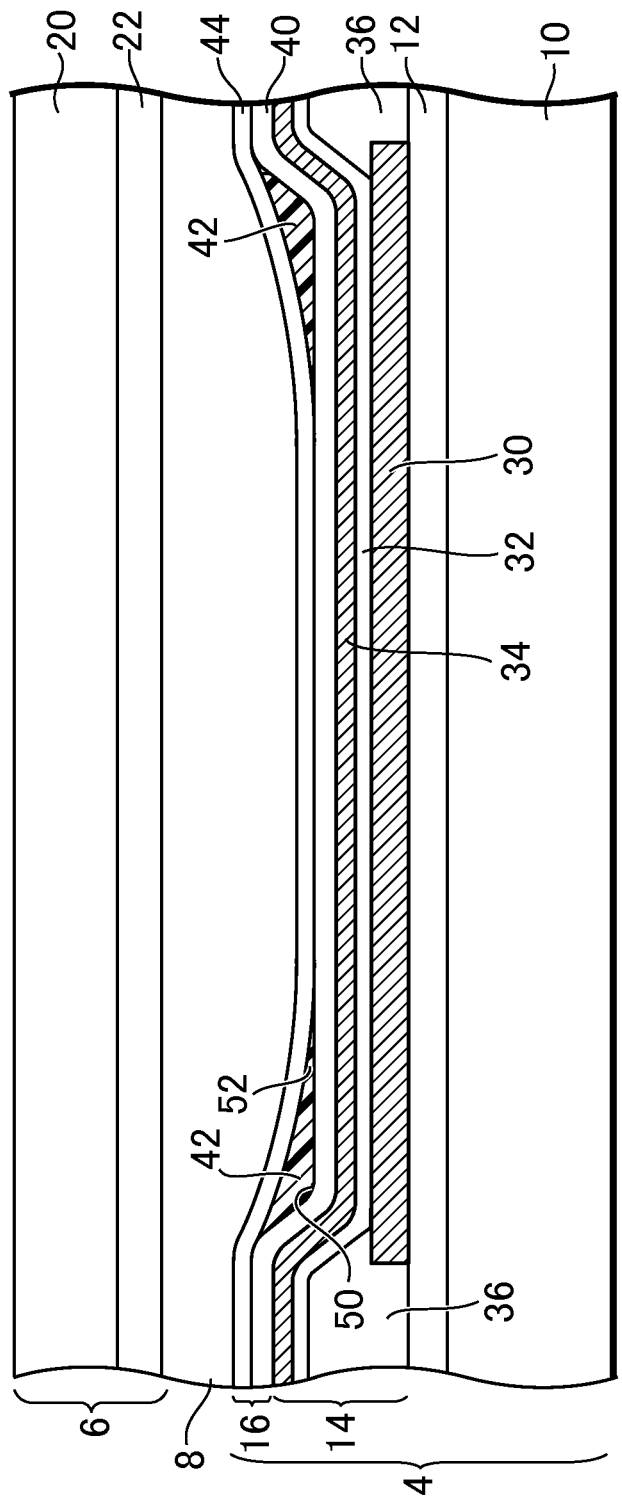
FIG. 12 is a schematic partial cross-sectional view of a display area in a conventional organic EL display device.

Differences between a structure of the sealing layer 116 according to this embodiment and a structure of the related art sealing layer 16 illustrated in FIG. 12 will be described. In the related art sealing layer 16, the inclination of the bank 36 is relatively gently formed so that the upper electrode 34 which is the electrode shared with the pixels in the overall display area is not torn at the step of the bank 36, and an angle of the inner corner at the step of the pixel edge becomes obtuse. On the contrary, in the cliff part 154 illustrated in FIG. 4, the angle of the inner corner becomes about 90° or acute. That is, in the vertical cross-section, a bottom and a step side surface of the pixel part are bent larger at the bank 120 of the cliff part 154 of this embodiment than the bank 36 of the related art. In a concave portion thus largely bent, the monomer of a fluid is more attracted to the inner corner, and a skirt 166 within the pixel part becomes shorter than the skirt 52 in FIG. 12. Hence, in addition to an improvement of the coatability of the above-mentioned second barrier layer 162 by the flattening layer 164, the step of the pixel edge is basically formed into the cliff part 154 in this embodiment. As a result, a formation area of the flattening layer 164 becomes smaller, and the probability that the layer floating is generated when a defect is generated in the second barrier layer 162 is lowered.

On the other hand, the upper electrode 128 is liable to be torn in the cliff part 154. Under the circumstances, the bank 120 in a part of the circumstance of the pixel part 150 is formed into the gently sloped part 152 illustrated in FIG. 5. The inclination angle α of the gently sloped part 152 is set so that a slope electrode part 170 is laminated on the side surface of the bank 120 of the gently sloped part 152 as the upper electrode 128, and the upper electrode 128 (in-pixel electrode part 172) laminated within each pixel part 150 and the upper electrode 128 (pixel boundary electrode part 174) laminated on an upper surface of the bank 120 are connected to each other by the slope electrode part 170. Since the pixel boundary electrode part 174 is connected to each other in a mesh over the overall pixel array part 62, the respective in-pixel electrode parts 172 connected to the pixel boundary electrode part 174 in the gently sloped part 152 is connected to each other to configure a common electrode. A width of the slope electrode part 170 is set taking an electric resistance in the slope electrode part 170 into account, and it is preferable that the width of the slope electrode part 170 is set so that a potential of the upper electrode 128 in the pixel part 150 basically becomes uniform in the pixel array part 62.

As described above, with the provision of the gently sloped part 152, the upper electrode 128 can be shared with the respective pixels regardless of whether the in-pixel electrode part 172 and the pixel boundary electrode part 174 are divided from each other in the cliff part 154, or not. In other words, from the above viewpoint, the upper electrode 128 can have a structure in which the in-pixel electrode part 172 and the pixel boundary electrode part 174 are divided from each other in the cliff part 154. In the above structure, the concave portion formed by the bottom and the step side surface of the pixel part in the cliff part 154 is acuter than the concave portion in the structure where the upper electrode 128 is continuous in the cliff part 154, and the monomer of the fluid can be more preferably attracted to the inner corner. As a result, the skirt 166 of the flattening layer 164 is further shortened to lower the layer floating probability.

Figure 6:
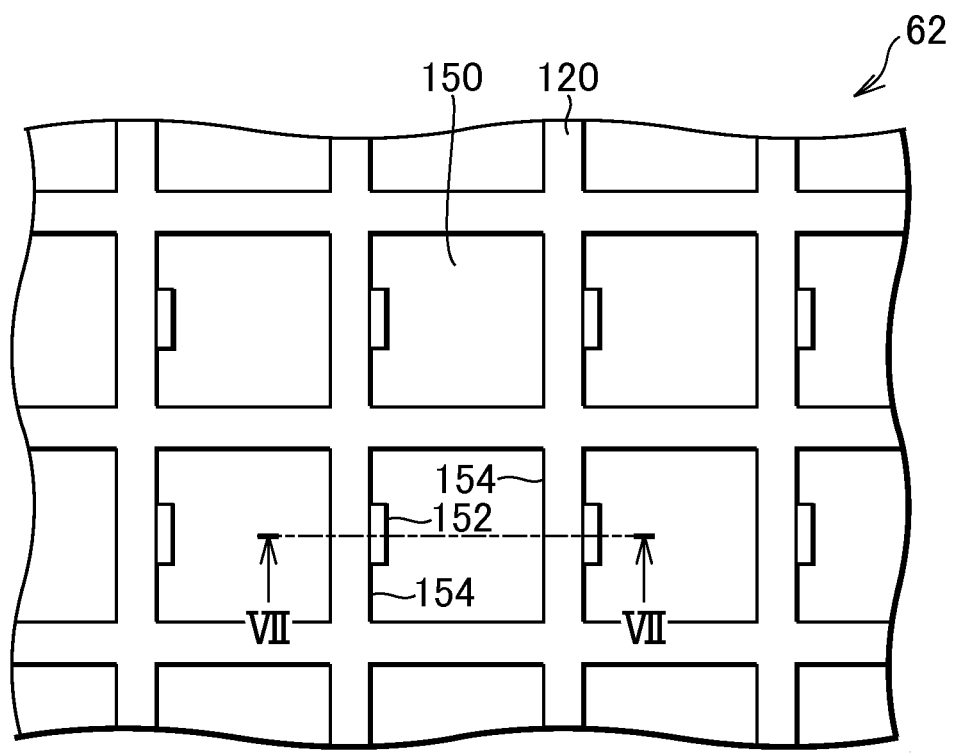
FIG. 6 is a schematic partial plan view of a pixel array part illustrating another arrangement example of the gently sloped part according to the first embodiment of the invention.

The number of the gently sloped part 152 provided in each pixel part 150 does not need to be one, but plural gently sloped parts 152 may be provided in each pixel part 150. Positions at which the gently sloped part 152 is provided in the respective pixel parts 150 do not need to be identical with each other. In this embodiment, the gently sloped part 152 is provided on one corner of the pixel part 150, but can be provided at another place of the edge of the pixel part 150. FIG. 6 is a schematic partial plan view of the pixel array part 62 in the organic EL display device 60 illustrating another example of the position at which the gently sloped part 152 is provided. In this example, the gently sloped part 152 is arranged in the center of one side of a rectangle that is a contour of the pixel part 150.

A portion related to the formation of the OLED part 114 which is a characteristic portion in the method of manufacturing the organic EL display device 60 will be mainly described. FIGS. 7A to 7D illustrate a process flow of an outline of the method of manufacturing the organic EL display device 60, and FIGS. 7A to 7D are schematic perpendicular cross-sectional views illustrating a main manufacturing process of the OLED part 114 in a laminated structure of the TFT substrate 100. The vertical cross-sectional view corresponds to a cross-section taken along a line VII-VII in FIG. 6.

The circuit part 112 is formed on one main surface of the glass substrate 110 through photolithography technique. An insulating film made of $SiO_2$ or SiN is deposited on a surface of the circuit part 112 through a chemical vapor deposition (CVD) technique. After contact holes (not shown) have been formed in the insulating film, a conductive film is formed on the insulating film. The conductive film is patterned through the photolithography technique to form the lower electrodes 124. The above-mentioned contact holes are filled with the lower electrodes 124, and each lower electrode 124 is electrically connected to a TFT (drive TFT 70 illustrated in FIG. 1) configuring the circuit part 112. It is preferable that the lower electrodes 124 are made of a transparent electrode material having a low resistance and a solvent resistance, and made of, for example, indium tin oxide (ITO). The lower electrodes 124 may be made of other transparent electrode materials, for example, indium zinc oxide (IZO), tin oxide, zinc oxide, indium oxide, or aluminum composite oxide. An ITO film configuring the lower electrodes 124 can be formed through reactive sputtering using $Ar+O_2$ mixture gas. The ITO film is patterned to form the lower electrodes 124 separated for the respective pixels.

In this embodiment, the organic EL display device 60 is of a top emission type, and the lower electrodes 124 can have a double-layered structure in which a transparent conductive film is laminated on a reflective layer made of a material high in optical reflectance. For example, the reflective layer can be made of aluminum (Al) or silver (Ag), and reflects a light from the light emitting layer toward the display surface, that is, the counter substrate 102 side.

Figure 7A:
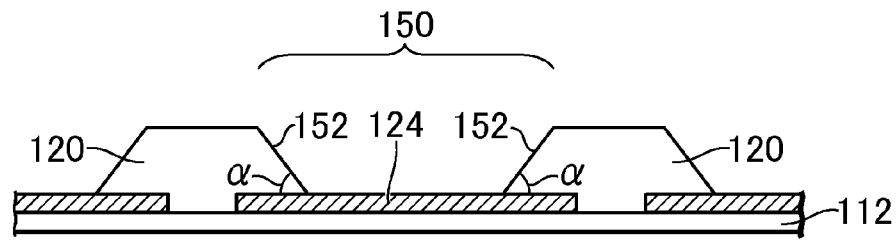
FIGS. 7A to 7D are schematic perpendicular cross-sectional views illustrating main steps of a manufacturing process for the organic EL display device according to the first embodiment of the invention.

After the lower electrodes 124 has been formed, the banks 120 are formed in the pixel boundaries. FIGS. 7A to 7D illustrate a process of manufacturing the banks 120. First, for example, a photosensitive acrylic resin is coated on the surface of the TFT substrate 100 on which the lower electrodes 124 have been formed to form a resin film. The resin film is subjected to exposure and development processing to selectively leave the resin film along the pixel boundary to form the banks 120, and an opening portion is formed in the pixel part 150 to expose each lower electrode 124. In this stage, each bank 120 has a forward tapered cross-section narrowing the width upward (FIG. 7A). Specifically, the side surface of the bank 120 is formed over the entire circumstance of the pixel part 150 at the inclination angle α. For that reason, in FIG. 7A, the inclination angles of the side surface of the bank 120 at positions other than the position where the gently sloped part 152 illustrated in FIG. 6 is to be formed is also formed at the acute angle α.

The forward tapered shape of the bank 120 can be formed in such a manner that after an acrylic resin film has been patterned, for example, by exposure and development processing, the TFT substrate 100 is heated to about a softening temperature of the acrylic resin to soften the bank 120, and the corner is made obtuse. Alternatively, when the pixel boundary area of the acrylic resin film is exposed and cured with the use of an exposure mask, the forward tapered shape can be formed by conducting inclined exposure through a rotational inclined exposure method. Also, when an area corresponding to the pixel part 150 of the insulating film is etched and removed to form the bank 120, the forward tapered shape can be formed by isotropic etching.

Figure 7B:
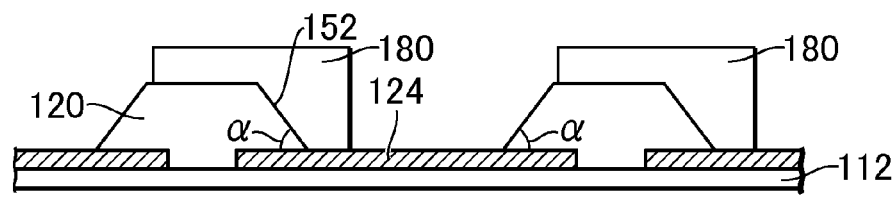
Figure 7C:
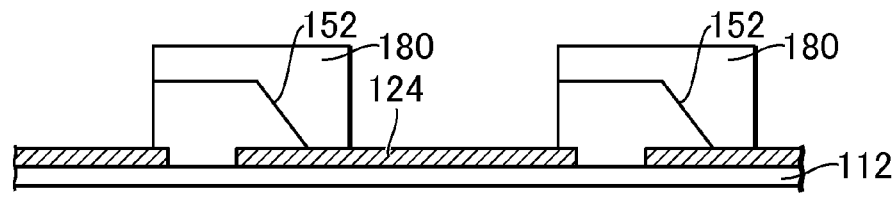
Figure 7D:
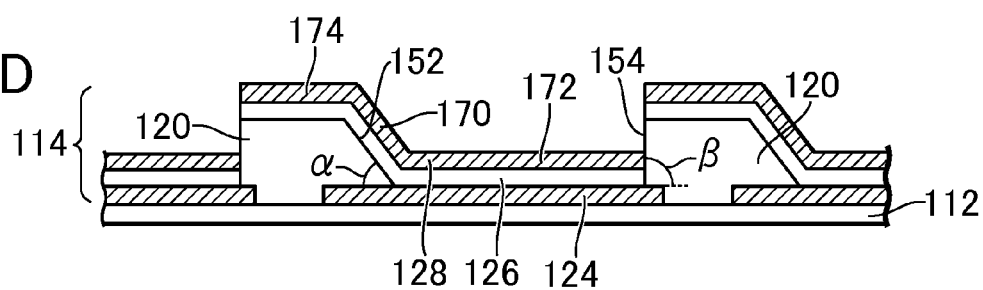

Subsequently, a resist film 180 is formed on the bank 120. The resist film is not formed on a place to be the cliff part 154 on the side surface of the bank 120 (FIG. 7B). If anisotropic etching, for example, using the dry etching technique is conducted with the resist film as an etching mask to remove the gently sloped part 152 at the place to be the cliff part 154, and the cliff part 154 is formed (FIG. 7C). With the above process, the bank 120 are formed into the gently sloped part 152 in only a part of the side surface surrounding the pixel part 150, and formed into the cliff part 154 in the remaining part. After the resist film 180 that covers the gently sloped part 152 has been removed, the organic layer 126 and the upper electrode 128 of the OLED are laminated on each other to form the OLED part 114 (FIG. 7D).

As described above, the organic layer 126 includes the hole transport layer, the light emitting layer, and the electron transport layer. The hole transport material forming the hole transport layer can be selected from, for example, metal phthalocyanines such as copper phthalocyanine or tetra (t-butyl) copper phthalocyanine, metal-free phthalocyanine, Quinacridone compound, aromatic amine-based low molecular weight hole injecting and transporting material such as 1,1-bis(4-di-p-tolylaminophenyl)cyclohexane, N,N'-diphenyl-N,N'-bis(3-methylphenyl)-1,1'-biphenyl-4,4'-diamine, N,N'-di(1-naphthyl)-N,N'-diphenyl-1,1'-biphenyl-4,4'-diamine, polymer hole transport material such as Poly(para-phenylene vinylene) or polyaniline, polythiophene oligomer material, and other known hole transport materials.

The light emitting layer allows a current to pass therethrough to emit a light, and an organic light emitting material that forms the light emitting layer is generally used as an organic light emitting material, and exemplified by known fluorescent low-molecular-weight material that can emit light from a singlet state such as coumarin based, perylene based, pyran based, anthrone based, porufiren based, quinacridone based, N,N'-dialkyl-substituted quinacridone based, naphthalimide based or N,N'-diaryl-substituted pyrrolo pyrrole based material, or known phosphorescent low-molecular-weight material that can emit light from a triplet state such as rare earth metal complex-based material.

A material configuring the electron transport layer may be a material generally used as an electron transport material, and exemplified by a low-molecular-weight material such as triazole based, oxazole based, oxadiazole based, silole system, or boron based material.

The method of forming the hole transport layer, the organic light emitting layer, and the electron transport layer can use a vacuum vapor deposition method for the vapor deposition type material, and a known film forming method such as a nozzle printing method, a spin coat method, a slit coat method, an inkjet method, or a relief printing method for a coating material.

The upper electrode 128 is made of a transparent electrode material, basically made of the same material as that of the lower electrode 124, and specifically can be made of a transparent electrode material such as ITO, IZO, tin oxide, zinc oxide, indium oxide, or aluminum composite oxide. The upper electrode 128 can be formed through, for example, a sputtering method.

The material of the respective layers configuring the OLED part 114 is not limited to the materials described above. Also, in this embodiment, the organic layer 126 is of a laminated structure including a hole transport layer, a light emitting layer, and an electron transport layer. Alternatively, the organic layer 126 can be of a laminated structure added with a layer such as a hole injection layer, a hole blocking layer, or an electron injection layer as needed. Those additional layers can be laminated by using basically the same forming method as that of the hole transport layer, the light emitting layer, and the electron transport layer.

The sealing layer 116 is formed on the OLED part 114 formed as described above to produce the TFT substrate 100 having the laminated structure illustrated in FIGS. 4 and 5.

As has already been described, the sealing layer 116 is formed with the first barrier layer 160, the flattening layer 164, and the second barrier layer 162.

The first barrier layer 160 is made of SiN, and can be formed through, for example, a plasma CVD (plasma enhanced chemical vapor deposition: PECVD) method. The SiN film is formed by generating plasma in a mixture gas containing $SiH_4$, $NH_3$, and $N_2$. For example, the SiN film thickness can be set to 500 nm. It is preferable that the substrate temperature does not rise as much as possible in the film forming process, and for example, the SiN film is formed at the substrate temperature of 100° C. or lower.

The first barrier layer 160 can be formed through an arbitrary appropriate process including a vacuum process of the conventional system such as sputtering, vapor deposition, sublimation, CVD, PECVD, or electron cyclotron resonance plasma-enhanced chemical vapor deposition (ECR-PECVD) method, or the combinations thereof.

The flattening layer 164 is formed in such a manner that a monomer film is formed through an arbitrary appropriate process including a vacuum process of the conventional system such as vapor deposition, sublimation, or the combination thereof as well as a coating process such as the nozzle printing method, the spin coat method, the slit coat method, the ink jet method, the relief printing method, intaglio offset printing method, or the letterpress reverse offset printing method, and the monomer is polymerized by the irradiation of ultraviolet rays into resin. In this embodiment, the flattening layer 164 is made of acrylic resin. A melting point of the acrylic monomer is −48° C., and the temperature of the TFT substrate 100 at the time of forming the monomer film is set to, for example, 0° C. With the above setting, the acrylic monomer flows on the surface of the adhered TFT substrate 100, and is localized to the irregular portion to smoothen the irregularity. Thereafter, the acrylic monomer is polymerized.

The second barrier layer 162 is made of SiN, and can be formed through the same film forming technique as that of the first barrier layer 160. For example, the second barrier layer 162 is formed through PECVD at the substrate temperature of 100° C. or lower as in the first barrier layer 160, and the SiN film thickness is set to 500 nm.

The TFT substrate 100 is fabricated in the above manner. The counter substrate 102 is fabricated in the same technique as the related art technique, separately from the TFT substrate 100. The TFT substrate 100 and the counter substrate 102 are bonded together by the filler layer 104. A space between the laminated body of the TFT substrate 100 side and the laminated body of the counter substrate 102 side is filled with the filler layer 104, and the filler layer 104 is sealed therebetween. The filler layer 104 is formed through an ODF (one drop fill) technique. Specifically, a dam agent (sealant) and a filler are coated on the counter substrate 102. The dam agent is coated around the pixel array part 62. The filler has fluidity, and flows into an area surrounded by the dam agent, and the area is filled with the filler. Thereafter, the TFT substrate 100 is placed on the coated surface of the counter substrate 102 with the filler layer 104, and the sealant is cured by the irradiation of ultraviolet rays or the like to bond both of the substrates 100 and 102 together.

In the above-mentioned embodiment, the gently sloped part 152 is formed on only one of both the side surfaces of the bank 120, and the cliff part 154 is formed on the other side surface at a position opposite to the gently sloped part 152. Alternatively, both those side surfaces facing each other at a given position of the bank 120 can be each formed with the gently sloped part 152.

Second Embodiment

Hereinafter, a description will be given of an organic EL display device 60 according to a second embodiment of the invention. In the components of this embodiment, parts common to those of the above first embodiment are denoted by identical symbols, a description of those components will be basically omitted, and differences from the first embodiment will be mainly described.

Figure 8:
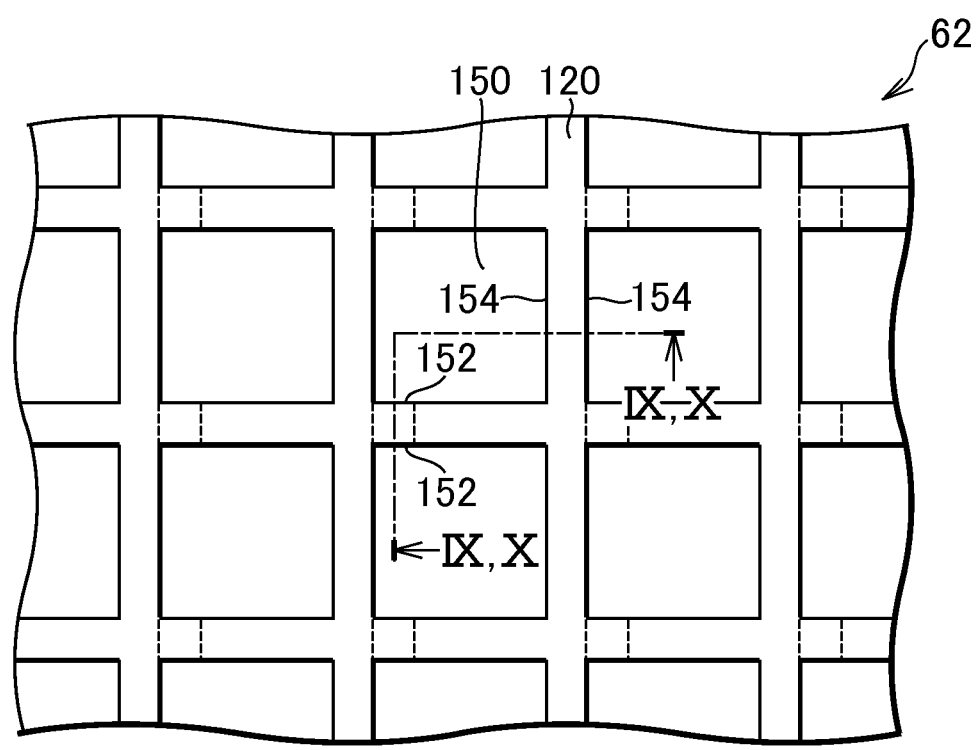
FIG. 8 is a schematic partial plan view of a pixel array part illustrating an arrangement example of a gently sloped part according to a second embodiment of the invention.

The second embodiment is different in a method of manufacturing the banks 120 from the first embodiment. FIG. 8 is a schematic partial plan view of a pixel array part 62 of the organic EL display device 60 illustrating an example of a position at which the gently sloped part 152 is provided according to the second embodiment of the invention. In the method of manufacturing the banks 120 according to this embodiment, both side surfaces facing each other at a given position of the bank 120 are each formed with the gently sloped part 152. In association with this configuration, in an example illustrated in FIG. 8, the gently sloped parts 152 are formed at two places of a rectangle forming a contour of the pixel part 150. Specifically, in the above example, the respective gently sloped parts 152 are disposed on the left sides of upper and lower sides of the rectangle forming the contour of each pixel part 150.

FIGS. 9A to 9D illustrate a process flow of an outline of the method of manufacturing the OLED part 114 in the second embodiment. FIGS. 9A to 9D illustrate vertical cross-sectional views of the TFT substrate 100 taken along a line IX-IX in FIG. 8 in the main manufacturing process of the OLED part 114, particularly, the banks 120.

Figure 9A:
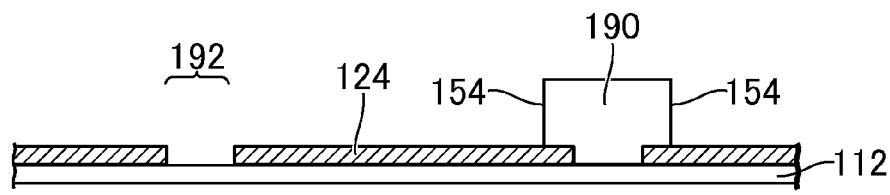
FIGS. 9A to 9D are schematic perpendicular cross-sectional views illustrating main steps of a manufacturing process for an OLED part according to the second embodiment of the invention.

As in the first embodiment, after the lower electrodes 124 has been formed, the banks 120 are formed in the pixel boundaries. First, a first photosensitive resin is coated on a surface of the TFT substrate 100 on which the lower electrodes 124 are formed to form a resin film. The resin film is subjected to the exposure and development processing to form a bank part 190 in which side surfaces of the bank 120 are cliff parts 154 (FIG. 9A). In this stage, as in the first embodiment, in the pixel part 150, the photosensitive resin is removed into an opening portion from which the lower electrodes 124 are exposed. Further, in this embodiment, the photosensitive resin is removed from an pixel boundary 192 at a position where the gently sloped part 152 is formed.

Figure 9B:
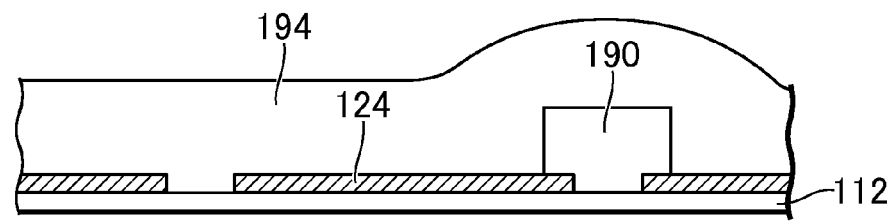
Figure 9C:
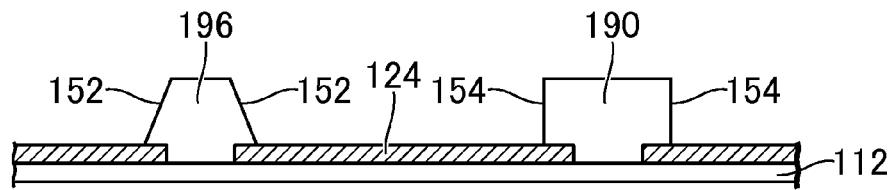

The second photosensitive resin is coated on the surface of the TFT substrate 100 on which the bank 120 of the cliff parts 154 is formed to form a resin film 194 (FIG. 9B). The resin film 194 is subjected to the exposure and development processing to form a bank part 196 in which the side surfaces of the bank 120 are the gently sloped parts 152 (FIG. 9C).

The forward tapered shape of the gently sloped part 152 of the bank 120 can be formed in such a manner that if a softening temperature of the second photosensitive resin is lower than that of the first photosensitive resin, the TFT substrate 100 is heated to soften the bank part 196, and the corner is made obtuse. Alternatively, the forward tapered shape can be formed by conducting the inclined exposure in selectively exposing and curing portions of the second photosensitive resin film at which the gently sloped parts 152 are formed with the use of an exposure mask. Also, if the insulating film forming the gently sloped part 152 is made of a material having no photosensitivity, an etching mask is formed on the portions where the gently sloped parts 152 are formed to conduct the etching process. As a result, the bank part 196 can be left, and in this situation, isotropic etching is conducted, thereby being capable of forming the forward tapered shape.

Figure 9D:
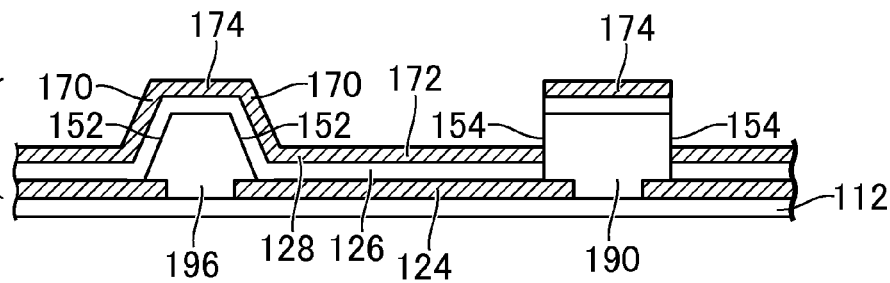

In this way, the bank 120 is formed with the gently sloped part 152 in only a part of the side surfaces surrounding the pixel part 150, and with the cliff parts 154 in the remaining parts. The organic layer 126 and the upper electrode 128 of the OLED are laminated on the surface of the TFT substrate 100 on which the bank 120 is formed to form the OLED part 114 (FIG. 9D).

The manufacturing process of the organic EL display device 60 after the OLED part 114 has been formed is identical with that in the first embodiment.

In the example illustrated in FIG. 8, the gently sloped part 152 is provided on the upper and lower sides of the rectangle forming the contour of each pixel part 150. Instead, the gently sloped parts 152 may be provided on the right and left sides of the rectangle, or the gently sloped parts 152 may be disposed on both of the upper and lower sides and the right and left sides. Also, the positions at which the gently sloped parts 152 are provided do not need to be identical with each other in the respective pixel parts 150. Also, in the example of FIG. 8, the gently sloped parts 152 are disposed at two portions of the respective pixel parts 150, but can be provided at only one portion.

Third Embodiment

Hereinafter, a description will be given of an organic EL display device 60 according to a third embodiment of the invention. In the components of this embodiment, parts common to those of the above first and second embodiments are denoted by identical symbols, a description of those components will be basically omitted, and differences from the first and second embodiments will be mainly described.

The third embodiment is different in the method of manufacturing the banks 120 from the first embodiment. In the method of manufacturing the banks 120 according to this embodiment, both of the side surfaces facing each other at a given position of the bank 120 are formed with the gently sloped parts 152 as in the second embodiment.

In the third embodiment, positions at which the gently sloped parts 152 are provided can be set to, for example, the positions illustrated in FIG. 8. FIGS. 10A to 10E illustrate a process flow of an outline of the method of manufacturing the OLED part 114 according to the third embodiment, and FIGS. 10A to 10E illustrate vertical cross-sectional views of the TFT substrate 100 taken along a line X-X in FIG. 8 in the main manufacturing process of the OLED part 114, particularly, the banks 120.

Figure 10A:
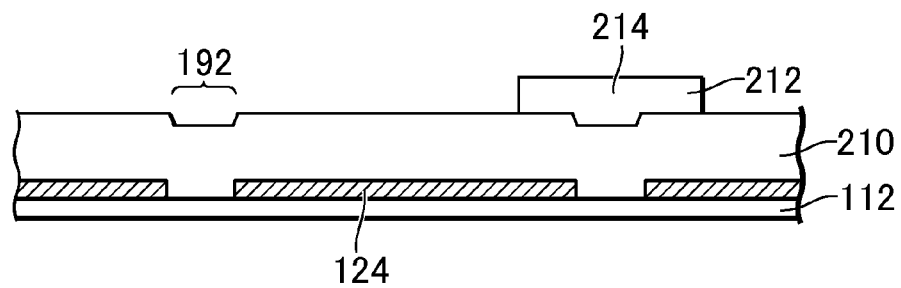
FIGS. 10A to 10E are schematic perpendicular cross-sectional views illustrating main steps of a manufacturing process for an OLED part according to a third embodiment of the invention.

As in the first and second embodiments, after the lower electrodes 124 have been formed, the banks 120 are formed in the pixel boundaries. First, a first bank formation layer 210 is formed on the overall surface of the pixel array part 62 on which the lower electrodes 124 are formed. The first bank formation layer 210 is made of, for example, SiN. Then, a bank part 214 formed of a second bank formation layer 212 is formed on the first bank formation layer 210 along the pixel boundary. The second bank formation layer 212 is made of, for example, a photosensitive resin, and a photosensitive resin is coated on the surface of the first bank formation layer 210 to form a resin film. The resin film is subjected to the exposure and development process to form the bank part 214 (FIG. 10A). In this example, the second bank formation layer 212 is removed from a position 192 at which the gently sloped part 152 is formed in the pixel boundary through the exposure and development process, and the bank part 214 is not formed at the position 192. The second bank formation layer 212 can be made of, for example, a material of acrylic.

Figure 10B:
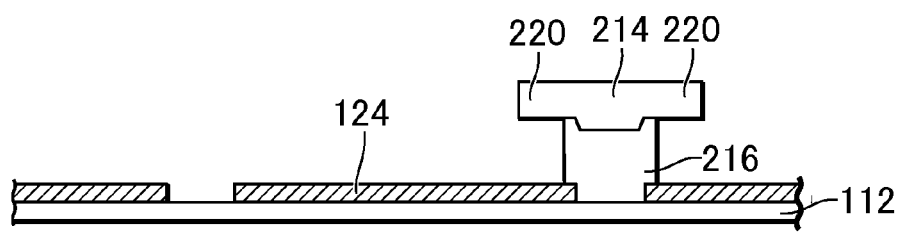
Figure 10C:
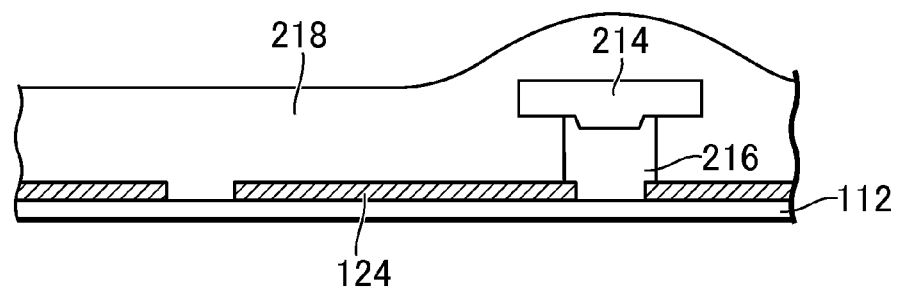

Further, the first bank formation layer 210 is etched with the second bank formation layer 212 of the bank part 214 as a mask to selectively leave the first bank formation layer 210 at a position corresponding to the bank part 214 (FIG. 10B). The etching process of the first bank formation layer 210 is conducted through a method having a selection ratio to the second bank formation layer 212, and the etching condition is set so that a width of a bank part 216 formed of the first bank formation layer 210 remaining under the bank part 214 becomes smaller than the bank part 214. A process of etching the first bank formation layer 210 can be conducted by, for example, dry etching. When the first bank formation layer 210 is made of SiN, and the second bank formation layer 212 is made of acrylic resin, the first bank formation layer 210 is removed through the dry etching process using a mixture gas plasma of sulfur hexafluoride ($SF_6$) and oxygen ($O_2$), and an overhang 220 where the bank part 214 is protruded laterally from the bank part 216 can be formed. A laminated body of the bank parts 214 and 216 forms a portion of the bank 120 in which the side surface is the cliff part 154.

Figure 10D:
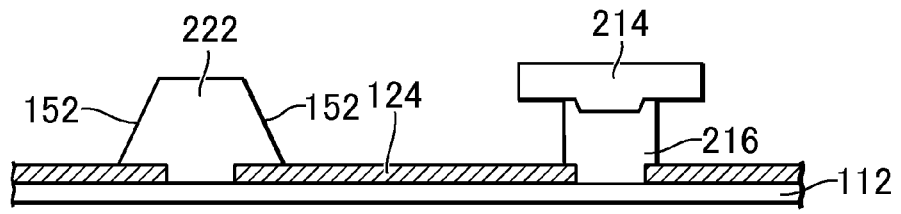

A third bank formation layer 218 is laminated on the pixel array part 62 on which the cliff part 154 is formed (FIG. 10C), and the third bank formation layer 218 is patterned to form a bank part 222 in which the side surface of the bank 120 is the gently sloped part 152 at a position 192 of the pixel boundary. In this way, only a part of the side surfaces surrounding the pixel part 150 is formed with the gently sloped part 152, and the remaining parts are formed with the cliff part 154 (FIG. 10D).

When the softening temperature of the third bank formation layer 218 is lower than that of the first bank formation layer 210 and the second bank formation layer 212, the forward tapered shape of the gently sloped part 152 of the bank part 222 can be formed in such a manner that the TFT substrate 100 is heated to soften the bank part 222, and the corner is made obtuse. Also, if the third bank formation layer 218 is made of a photosensitive resin, the forward tapered shape can be formed by conducting the inclined exposure in selectively exposing and curing portions of the third bank formation layer 218 at which the gently sloped parts 152 are formed. Also, when the third bank formation layer 218 is made of a non-photosensitive material, an etching mask is formed at a position 192, and a bank part 222 can be left through the etching process. In this situation, the isotropic etching is conducted so that the bank part 222 can be formed in the forward tapered shape. For example, the third bank formation layer 218 can be made of a photosensitive acrylic resin.

Figure 10E:
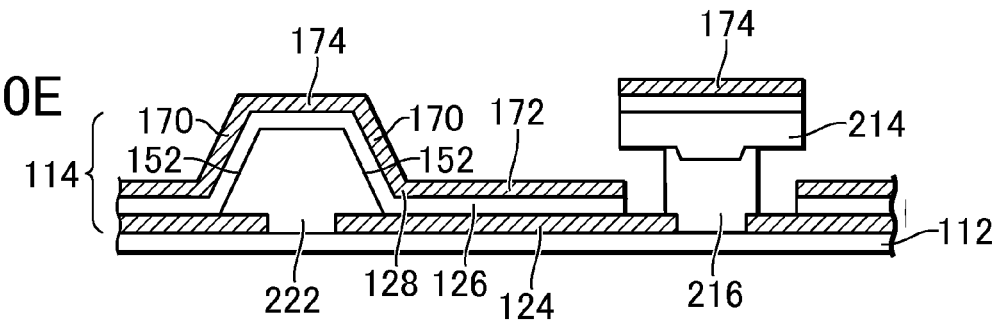

The organic layer 126 and the upper electrode 128 are laminated on the surface of the TFT substrate 100 on which the bank 120 is formed to form the OLED part 114 (FIG. 10E). A process of manufacturing the organic EL display device 60 after the formation of the OLED part 114 is identical with that in the first embodiment.

Figure 11:
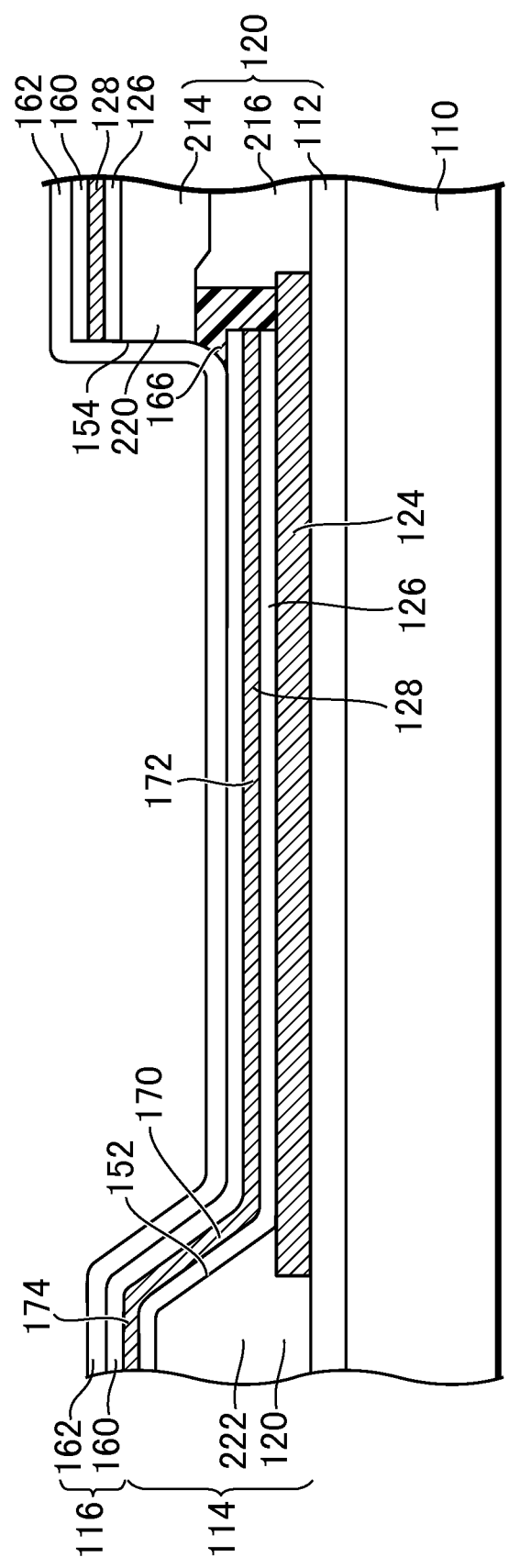
FIG. 11 is a schematic partial cross-sectional view of a pixel array part in a state where a sealing layer is further formed on a structure illustrated in FIG. 10E.

FIG. 11 is a schematic partial cross-sectional view of the pixel array part 62 in a state where the sealing layer 116 is further formed on the structure illustrated in FIG. 10E. In this embodiment, the bank 120 whose side surface is the cliff part 154 has a cross-section of a reverse taper shape whose upper side (bank part 214) is wider than the lower side (bank part 216). For that reason, the organic layer 126 and the upper electrode 128 are liable to be divided on the side surface of the bank 120 by the cliff part 154, and a concave portion that suitably attracts the monomer configuring the flattening layer 164 is liable to be formed at the time of forming the sealing layer 116. As a result, the skirt 166 of the flattening layer 164 is further shortened to lower the layer floating probability.

In particular, a cavity under the overhang 220 may remain without being embedded with the organic layer 126, the upper electrode 128, and the first barrier layer 160. In this state, the monomer forming the flattening layer 164 adhered to the surface of the first barrier layer 160 enters the cavity under the overhang 220 in the cliff part 154, the skirt 166 of the flattening layer 164 is shortened, and the layer floating probability is suitably lowered.

For example, the thicknesses of the respective layers are set so that the position of the lower surface of the overhang 220 which is determined according to the thickness of the first bank formation layer 210 becomes higher than the surface of the first barrier layer 160 in the pixel part 150. This makes it difficult to close an inlet of the cavity under the overhang 220 by the organic layer 126, the upper electrode 128, and the first barrier layer 160 laminated in the pixel part 150 at the time of forming the first barrier layer 160. Hence, there is advantageous in that the monomer is liable to enter the cavity. On the other hand, if the inlet of the cavity is too opened at the time of forming the first barrier layer 160, the inlet is hardly closed by the second barrier layer 162, resulting in a risk that the flattening layer 164 within the cavity is exposed. Therefore, taking the above into account, the height of the overhang 220, and the thicknesses of the organic layer 126, the upper electrode 128, the first barrier layer 160, and the second barrier layer 162 are set. For example, a height of a lower surface of the overhang 220 can be set to be higher than the surface of the first barrier layer 160, and lower than the surface of the second barrier layer 162.

As in the second embodiment, the gently sloped part 152 in the structure of the bank 120 according to this embodiment can be arranged at an arbitrary position of the contour of the respective pixel parts 150, and the number of portions at which the respective pixel parts 150 are provided may be one or plural.

Also, in the above respective embodiments, the first barrier layer 160 and the second barrier layer 162 are made of SiN, but can be made of another silicon compound that functions as a passivation film to the OLED. For example, the barrier layers can be made of SiO or SiCN. The flattening layer 164 is not limited to acrylic resin, but can be made of another flattening resin.

According to the above-mentioned invention using the embodiments, the organic EL display device that improves the reliability of the sealing layer laminated on the OLED, and hardly deteriorates the OLED can be realized, and the yield of the manufacturing of the organic EL display device is improved.

While there have been described what are at considered to be certain embodiments of the invention, it will be understood that various modifications may be made thereto, and it is intended that the appended claims cover all such modifications as fall within the true spirit and scope of the invention.

What is claimed is:

1. An organic electroluminescence display device comprising:
    a plurality of pixels formed in a display region, each of the plurality of pixels including an anode, an organic material on the anode, and a cathode on the organic material, each of the organic material and the cathode being shared by the plurality of pixels;
    a bank which is formed along a boundary of the pixel and covers a periphery of the anode; and
    a sealing layer which seals the plurality of pixels and includes a first inorganic insulation film, a resin on the first inorganic insulation film, and a second inorganic insulation film on the resin and the first inorganic insulation film;
    wherein the bank includes a first cliff-off portion, a second cliff-off portion and a forward taper slope portion,
    the first cliff-off portion is positioned above the anode and has a first side surface as a side surface of the bank, the first side surface being adjacent to an upper surface of the bank,
    the forward taper slope portion is positioned above the anode and has a second side surface as a side surface of the bank, the second side surface being adjacent to an upper surface of the bank,
    the second cliff-off portion is positioned below the first cliff-off portion and the forward taper slope portion and beside the anode, and has a third side surface as a side surface of the bank, the third side surface facing a side surface of the anode, each of an inclination angle of the first side surface and an inclination angle of the third side surface is larger than an inclination angle of the second side surface, the organic material and the cathode contact with the bank, the part of the anode contacts with the organic material, the organic material is connected to the cathode in a first region directly above the part of the anode, each of the organic material and the cathode is continuously formed from a second region directly above the second side surface of the forward taper slope portion to the first region directly above the part of the anode, and each of the organic material and the cathode is divided between a third region directly above the first side surface of the first cliff-off portion and the first region directly above the part of the anode.

2. The organic electroluminescence display device according to claim 1, wherein the resin is arranged on a boundary between the part of the anode and the bank in plan view, and wherein a first width of the resin arranged along the first cliff-off portion is narrower than a second width of the resin arranged along the forward taper slope portion in plan view.

3. The organic electroluminescence display device according to claim 2, wherein the first cliff-off portion contact with the sealing layer, and wherein the organic material and the cathode is arranged between the forward taper slope portion and the sealing layer.

4. The organic electroluminescence display device according to claim 2, wherein the bank includes a first material including the first cliff-off portion and a second material including the forward taper slope portion.

* * * * *